March 23, 1965 YASUTOMO MIYAKE ETAL 3,175,168
CRYSTAL-CONTROLLED TRANSISTOR OSCILLATOR HAVING MINIMUM FREQUENCY DEVIATION WITH TEMPERATURE VARIATION
Filed Oct. 4, 1962
Fig. 1 Fig. 2 Fig. 3
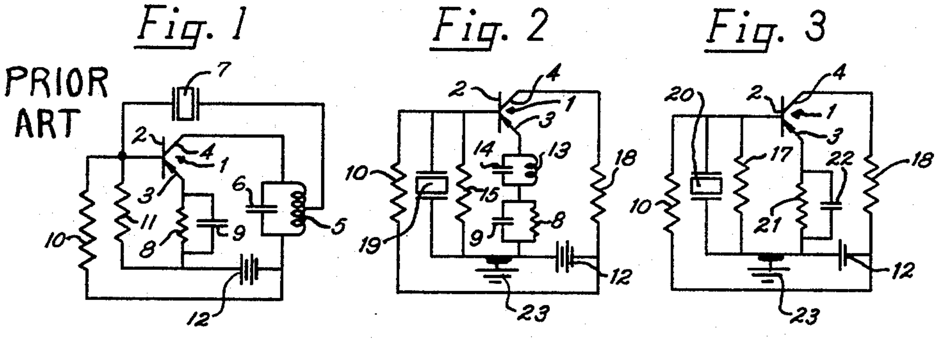
Fig. 4 Fig. 5
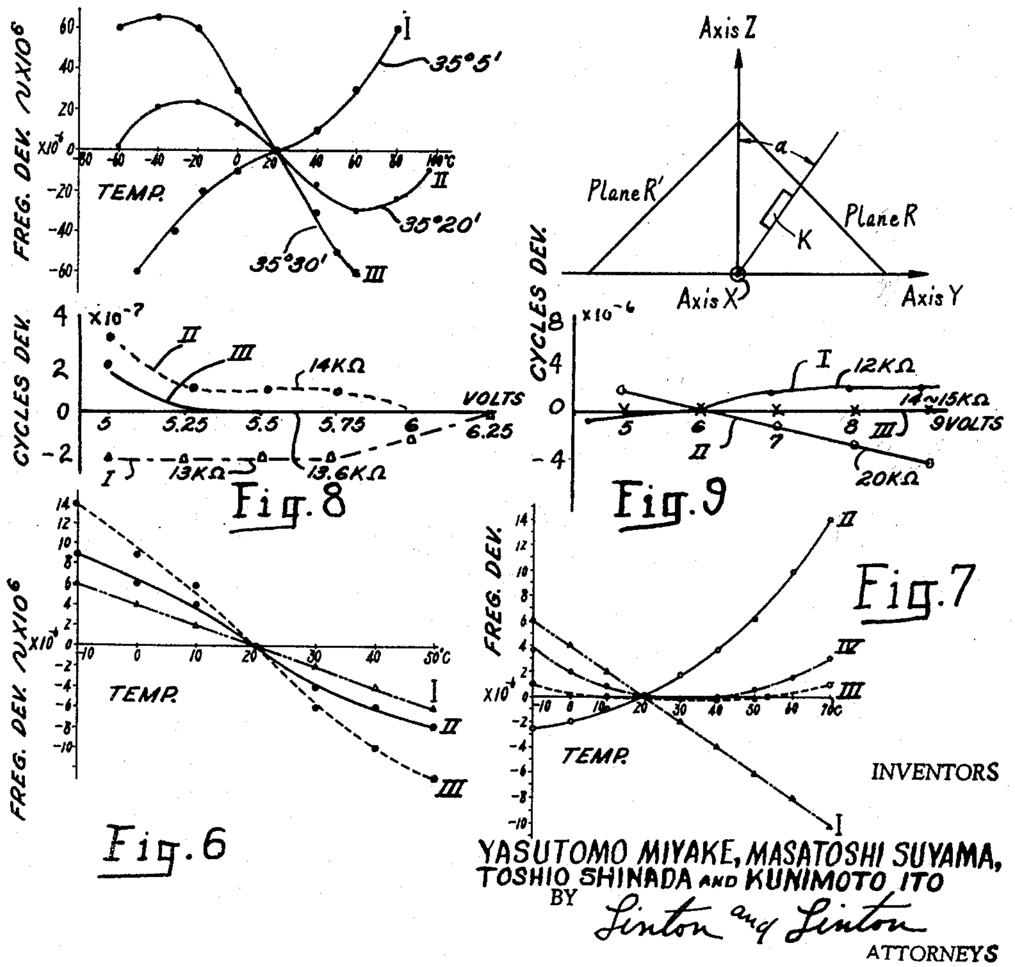
Fig. 8, Fig. 9, Fig. 6, Fig. 7
INVENTORS
YASUTOMO MIYAKE, MASATOSHI SUYAMA, TOSHIO SHINADA AND KUNIMOTO ITO
BY Linton and Linton
ATTORNEYS 3,175,168

CRYSTAL-CONTROLLED TRANSISTOR OSCILLATOR HAVING MINIMUM FREQUENCY DEVIATION WITH TEMPERATURE VARIATION

Yasutomo Miyake, Kohokuku, Yokohama, Masatoshi Suyama, Kawasaki, and Toshio Shinada and Kunimoto Ito, Chofu, Tokyo, Japan, assignors to K. K. Kinsekisha Kenkyujo, Tokyo, Japan, a corporation of Japan Filed Oct. 4, 1962, Ser. No. 228,438
Claims priority, application Japan, Dec. 15, 1958, 33/35,770
5 Claims. (Cl. 331—116)

The present invention relates to a crystal-controlled transistor oscillator having high stability of frequency and current intensity against temperature change over a wide range of the short wave band.

The present invention comprises a non-tuned oscillating system provided with a transistor and a crystal unit, this crystal unit having a plane surface, which plane contains the X axis and has a cut angle of from 34°51′ to to 35°14′ to the Z axis, at the side of a crystal face plane and on the YZ plane.

The present application is a continuation-in-part of our copending application Serial No. 859,230 filed December 14, 1959, now abandoned.

The features and advantages of this present invention will become apparent from the following description of the present invention taken in connection with the accompanying drawings in which:

FIG. 1 is an example of a tuning type crystal-controlled transistor oscillator circuit, of the prior art, showing a collector tuning circuit.

FIG. 2 is a tuning type crystal controlled oscillator circuit having a resistor in the transistor collector circuit.

FIG. 3 is an example of a non-tuning type crystal-controlled transistor oscillator circuit according to the present invention.

FIG. 4 is an example of characteristic curves of frequency deviation against temperature change (hereafter called temperature characteristic curves) of the crystal itself taken along according to different cut angles of the crystal.

FIG. 5 is a schematic illustration diagram of the cut angle of the crystal with regard to this present invention.

FIG. 6 and FIG. 7 are temperature characteristic curves of a crystal-controlled transistor oscillator, the former showing an example with regard to a conventional oscillator of the prior art, and the latter an example of such curves with regard to an oscillator of this present invention.

FIG. 8 shows for the oscillator of FIG. 3 the characteristic curve of frequency deviation against source voltage.

FIG. 9 shows for the oscillator of FIG. 2 the characteristic curves of frequency deviation against source voltage.

In cases where the employed frequency range is limited to a narrow range, a fairly good temperature characteristic is to be expected with a tuning type conventional crystal-controlled transistor oscillator, by means of an appropriate selection of components to compensate for the temperature characteristics of the transistor or the crystal unit. But in cases where the employed frequency range is wide, the oscillator of the above mentioned tuning type is found to be unstable and useless, because of these components having various different temperature characteristics for each frequency. On the other hand, with a non-tuned circuit, as well as with a tuned circuit having a tuning frequency sufficiently out of tune as to the natural resonant frequency of the crystal unit, the amplitude of oscillation for temperature change is stable, even if the employed frequency range is wide, on account of lack of steep slope on the oscillation curve near the resonant point.

FIG. 1 shows for the prior art a conventional tuning type crystal controlled transistor oscillator circuit of the collector tuning type, in which the transistor 1 has a base 2 and an emitter 3 and a collector 4. A tuned circuit unit includes inductance 5 and capacitance 6, and this unit is connected in series in the lead from collector 4. A unit including resistance 8 and capacitance 9 connected in parallel is connected in series in the lead from emitter 3. A resistance 10 is connected between tuned circuit unit 5–6 and the base 2. A resistance 11 is connected through bias battery 12 between tuned unit 5–6 and base 2. A frequency determining piezoelectric crystal 7 is connected between a point on tuning inductance 5 and the base 2.

FIG. 2 shows a modified tuning type crystal controlled transistor oscillator circuit of the emitter tuning type which is somewhat similar to the circuit of FIG. 1 and is tuned by inductance 13 and capacitance 14 and has elements 1, 2, 3, 4, 8, 9, 10, 12 as in FIG. 1, but which is modified and omits the tuning unit 5–6 in the collector lead of FIG. 1, and has a tuning unit including parallel connected inductance 13 and capacitance 14 in the emitter lead, and has crystal 19 connected in parallel with resistance 15 between the transistor base 2 and the positive terminal of battery 12. A resistor 18 is connected in series with transistor collector 4 and to the negative terminal of battery 12, as hereinafter described in detail. The positive terminal of battery 12 is connected to ground at 23.

FIG. 3 shows according to the present invention a non-tuning type crystal-controlled transistor oscillator circuit whch has some similarities to FIG. 2, but which omits the tuning unit in the lead of emitter 3 consisting of parallel connected inductance 13 and capacitance 14. This circuit of FIG. 3 includes transistor 1 having base 2, emitter 3, and collector 4. A resistance 18 is connected in series in the lead of transistor collector 4, between the collector 4 and the negative terminal of battery 12 as in FIG. 2. A unit including parallel-connected resistance 21 and capacitance 22 is connected in series in the lead of emitter 3, which goes to the positive terminal of battery 12 which is connected to ground at 23. A resistance 10 is connected between the negative terminal of battery 12 and transistor base 2 as in FIG. 2. Piezoelectric crystal 20 preferably quartz and resistance 17 are connected in parallel between the positive terminal of battery 12 and transistor base 2. It will be noted that there is no connection to ground as to high frequency from transistor collector 4, and that transistor collector 4 is insulated from ground as to high frequency. It will also be noted that in FIG. 3 as well as in FIG. 2 the command circuit of transistor collector 4 has the serially connected resistor 18, which greatly improves operation between collector 4 and the negative terminal of battery 12. Appropriate values of resistance 18 are between 12 and 20 kilohms, for the circuits of FIGS. 2 and 3.

The curves II and III in FIG. 4 show examples of temperature characteristics of the type of crystal unit taken alone by itself which is suitable to be inserted in the crystal controlled vacuum tube oscillator. The above mentioned crystal units for oscillators are of cut angles 35°05′ (curve I), 35°20′ (curve II) and 35°30′ (curve III) respectively. These curves of FIG. 4 are for the crystals taken alone by themselves for an oscillator frequency of 7 mc. Curve II of FIG. 4 is for a conventional type of crystal.

In FIG. 4, FIG. 6 and FIG. 7, the horizontal axes and vertical axes show the applied temperatures and the frequency deviations respectively and the deviations are in parts per million.

In FIG. 5, $\alpha$ is the cut angle of the crystal, K is the cut crystal plate, axes X, Y and Z are the electrical, mechanical and optical axes of the crystal respectively. Plane R is a natural face of the crystal which is formed by passing a plane at substantially 38°13′ to the optical axis of the crystal, this plane R being parallel to the electrical axis of the crystal. Plane YZ is perpendicular to the electrical axis of the crystal. Plane R′ is another natural face of the crystal which is formed by passing a plane at the angle which is supplementary to 38°13′ to the optic axis of the crystal. This plane R′ is parallel to the electrical axis of the crystal and at the other side of the optic axis against plane R.

It has been found by experiments that the temperature characteristic curve of a particular transistor is as shown by curve I in FIG. 6. This curve I in FIG. 6 has a negative characteristic and is almost linear. Since the allowable operating temperature range of transistors is —10° to +70° C., and since the temperature characteristic curve of a conventional crystal unit of the prior art is such as is shown by curve II in FIG. 6, it is a natural result, that a crystal-controlled transistor oscillator will have the temperature-frequency characteristic as shown by the curve III in the same figure, which is the functional or electrical addition of the curves I and II of FIG. 6, and which is worse than the corresponding characteristic curves of a transistor or a crystal unit separately.

From the above-mentioned facts, it will be easy to be guided to the conclusion, that, to make the temperature-frequency characteristics of a crystal-controlled transistor oscillator flat, it is necessary to adopt a crystal unit having positive temperature characteristics such as are shown for instance by the curve I in FIG. 4 (this curve is obtained with a crystal unit having a cut angle 35°05′).

But it is yet unknown which crystal unit with positive characteristic range must be adopted for obtaining an oscillator which will be of practical use, since a practical oscillator is required to be provided with a flat temperature characteristic viz, the frequency deviation must be under $\pm 10^{-6}$ at the temperature and frequency range employed, as well as because the actual observed characteristic curve will never be obtained, as mentioned in the following description, by a diagrammatical superposition of a characteristic curve of a transistor and that of a crystal unit.

The curves I and II in FIG. 7 show for the present invention the temperature characteristics of a transistor (HJ–23D) operated at 2.992392 mc. and of a crystal unit of cut angle 35°05′ respectively. The curve II of FIG. 7 relates to the performance of a crystal in the circuit of FIG. 3. When these curves I and II of FIG. 7 are additively combined diagrammatically, the computed curve IV in the same figure is obtained. But the temperature characteristic curve actually experimentally obtained with an oscillator with the above mentioned transistor and crystal unit instead is curve III in the same figure which observed curve is satisfactory to have a flat characteristic as required, and not curve IV.

It is apparent from FIGS. 6 and 7 that the slope of the transistor temperature characteristic curve has a frequency deviation of about $\pm 6\times 10^{-6}$ within a temperature range of ±30° C. to the center temperature 20° C.

It is known by Wolfskill Patent No. 2,467,353 that broadly a high frequency harmonic crystal unit should have a cut angle of between 20° and 40°, and that a crystal unit having a 30° cut angle is optimum.

I have found that a cut angle of 35°05′ is optimum to have the most appropriate positive frequency-temperature characteristic curve for compensating the negative characteristic curve of a transistor in the temperature range of —10° C. to +70° C. to have a frequency deviation of the magnitude as shown by the curve II in FIG. 7 of the present invention.

A thermostat must be used with the Wolfskill arrangement to get frequency control. Heretofore it has been unknown to have a transistor temperature characteristic which is negative as shown by the curve I of FIG. 7. It would be an ill-advised attempt to attempt to design a transistorized crystal oscillator with a broad range of oscillation frequency of 1 to 10 megacycles and with an operating temperature range of from —10° to +70° C., because the characteristic curve of a transistor may be flat or positive. The temperature characteristic curve of the transistor is found by measurement to be actually negative and linear. And, this negative characteristic of the transistor has now been compensated for the first time by a positive temperature characteristic of a crystal unit as shown by curve II in FIG. 7.

A diagrammatical adding of curves I and II of FIG. 7 makes curve IV of FIG. 7. This so computed curve IV has a frequency deviation of coefficient of 3 to $4\times 10^{-6}$ in the temperature range —10 to +70° C., and an oscillator having this characteristic curve IV is useless in this wide temperature range. But, in this case, the frequency deviation $1\times 10^{-6}$ which value is of use for a high-frequency oscillator, is attained at a temperature range of +10° to +50° C., and this oscillator can be put to practical use. Such an oscillator is equivalent to that shown in FIG. 3 but has the resistance 18 short circuited.

Furthermore, in the arrangement according to the present invention there has been inserted a resistance 18 (FIG. 3) in the collector circuit between the transistor collector and ground 23 which is a new arrangement. By the insertion of such a collector circuit resistance 18, the transistor collector 4 is made to float as to high-frequency electric current from ground. Such a resistance has never been so inserted heretofore because it has been considered that oscillation would stop because of such insertion. But, by an appropriate selection of this resistance value for resistor 18, the oscillation never stops and the temperature characteristic curve IV becomes improved to curve III as actually observed, (FIG. 7) which latter characteristic curve shows a frequency deviation of less than $1\times 10^{-6}$ over a wide temperature range —10° to +70° C., which covers the usual temperautre range of the operation of the transistor.

When such a resistance is inserted in the collector circuit, it was found by us also that the frequency deviation for a given electric source voltage change becomes very small. The feature of such a condition is shown in FIG. 8.

The types and values of the oscillator circuit components of FIG. 3, which oscillator was designed for the tests of frequency deviation to electric source voltage change, are as follows:

| | |
|---|---|
| Transistor 1 | 2SA76. |
| Crystal unit 20 | Oscillation frequency 5 mc., cut angle 35°05′. |
| Capacitance 22 | 2000 micro-micro farads. |
| Resistance 10 | 300 kilohms. |
| Resistance 17 | 50 kilohms. |
| Resistance 21 | 1 kilohm. |

As shown in FIG. 8, when the collector circuit resistance 18 is 13.6 kilohms, the voltage characteristic curve is almost flat, that is, the frequency deviation to electric source voltage change is negligibly small in the voltage range from 5.25 to 6.25 volts.

FIG. 8 shows frequency deviation against electric source voltage characteristic curves of the crystal controlled transistor oscillator having a non-tuned oscillating system which is shown in FIG. 3. The curves I, II, and III correspond to the cases in which the values of the collector resistance 18 are 13 kiloms, 14 kilohms, and 13.6 kilohms respectively.

FIG. 9 shows the frequency deviation against electric source voltage characteristic curves of the crystal controlled transistor oscillator having a tuned oscillating system which is shown in FIG. 2. The curves I, II, and III of FIG. 9 correspond to the cases in which the values of the collector resistance 18 are 12 kilohms, 20 kilohms, and 14 to 15 kilohms respectively.

It has been also found that not only in the case of a non-tuned transistorized crystal oscillator as shown in FIG. 3, but also in the case of a tuned oscillator as shown in FIG. 2, the insertion of a collector circuit resistance makes the frequency deviation to electric source voltage change small. Such characteristic curves are those shown in FIG. 9. When the collector-circuit resistance 18 is 14 to 15 kilohms, the change of frequency deviation for a given change of electric source voltage is almost negligible in the voltage range 5 to 9 volts. The types and numerical values of the circuit components of FIG. 2, which oscillator circuit was designed for such tests, are as follows:

| | |
|---|---|
| Transistor 1 | 2SA76. |
| Crystal unit 19 | Oscillation frequency 5mc, cut angle 35°05'. |
| Inductance 13 | 30 millihenries. |
| Capacitance 14 | 50 micro-micro farads. |
| Capacitance 16 | 2000 micro-micro farads. |
| Resistance 10 | 1 megohm. |
| Resistance 15 | 300 kilohms. |
| Resistance 23 | 1 kilohm. |

Having regard to the above described facts, we have discovered by experiments, a cut plane and cut angles being suitable for being adopted. The cut plane determined for an operating range of the short wave band from 1 to 10 mc. and at a temperature range from −10° to +70° C., which is allowable temperature range of oscillation, must contain the X axis of the crystal. And the range found of cut angles of the crystal under the above-mentioned conditions are from 34°51' to 35°14' to the Z axis at the side of the crystal face plane R and on the plane YZ.

By the above-mentioned procedure, it is made possible to provide a crystal-controlled transistor oscillator extremely stable as to intensity of the oscillation as well as to the frequency thereof, at a range of the short wave band from 1 to 10 mc., and within the allowable operating temperature range of said oscillator.

It will be apparent to those skilled in the art that our invention is susceptible of various modifications to adapt the same to particular applications, and all such modifications which are within the appended claims, we consider to be comprehended within the spirit of our invention.

Having thus described our invention, what we claim is:

1. In a temperature compensated oscillator system, a non-tuned transistor oscillator comprising a transistor having a base, an emitter, and a collector, and a piezoelectric crystal unit, a pair of electrodes for said crystal unit, said crystal unit having a surface plane, said surface plane containing the X axis of the crystal unit and having a cut angle of from 34°51' to 35°14' to the crystal Z axis at the side of a plane R on the YZ plane, where X is the crystal electrical axis, Z is the crystal optic axis, Y is the mechanical axis, the YZ plane is perpendicular to the crystal electrical axis, and R is a natural crystal face passing at substantially 38°13' to the optic axis and perpendicular to the mechanical axis, said crystal unit having a positive temperature characteristic of frequency deviation against temperature, a biasing battery, the positive terminal of said battery being grounded, said crystal unit being connected between the base of said transistor and the positive terminal of said battery, a high resistance connected between the collector of said transistor and the negative terminal of said battery, and an impedance unit consisting of a parallel connected capacitance and resistance connected between said emitter and the positive terminal of said battery.

2. A system according to claim 1, and a resistance connected between the base of said transistor and the positive terminal of said battery.

3. A system according to claim 1, said crystal unit having a cut angle of substantially 35°5'.

4. A system according to claim 1 and a resistance of large value connected in parallel across the electrodes of said crystal unit.

5. A system according to claim 1, the value of said resistance connected between the collector of said transistor and the negative terminal of the battery being between 12 and 20 kilohms.

References Cited by the Examiner

UNITED STATES PATENTS

| | | | |
|---|---|---|---|
| 2,745,010 | 5/56 | Stansel | 331—116 |
| 2,769,908 | 11/56 | Stansel | 331—116 |

OTHER REFERENCES

Handbook of Piezoelectric Crystals for Radio Equipment Designers, by John P. Buchanan, Wright Air Development Center, TK-6565-07P5-C5, page 38.

ROY LAKE, *Primary Examiner.*

JOHN KOMINSKI, *Examiner.*